US010679920B2

(12) United States Patent
Niimi et al.

(10) Patent No.: US 10,679,920 B2
(45) Date of Patent: Jun. 9, 2020

(54) SEMICONDUCTOR DEVICE HAVING SEMICONDUCTOR PACKAGE IN A WIRING BOARD OPENING

(71) Applicant: Panasonic Intellectual Property Management Co., Ltd., Osaka (JP)

(72) Inventors: Hideki Niimi, Osaka (JP); Tatsuo Sasaoka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/245,168

(22) Filed: Jan. 10, 2019

(65) Prior Publication Data

US 2019/0229029 A1 Jul. 25, 2019

(30) Foreign Application Priority Data

Jan. 22, 2018 (JP) .................................. 2018-007768
Oct. 26, 2018 (JP) .................................. 2018-201386

(51) Int. Cl.
*H01L 23/367* (2006.01)
*H01L 23/00* (2006.01)
*H01L 23/498* (2006.01)
*H01L 23/13* (2006.01)

(52) U.S. Cl.
CPC ............ *H01L 23/367* (2013.01); *H01L 23/13* (2013.01); *H01L 23/49811* (2013.01); *H01L 24/08* (2013.01); *H01L 2224/08155* (2013.01)

(58) Field of Classification Search
CPC ... H01L 23/49811; H01L 23/13; H01L 24/08; H01L 2224/08155; H01L 23/367; H01L 23/49838; H01L 24/83
See application file for complete search history.

(56) References Cited

U.S. PATENT DOCUMENTS

| 6,158,116 | A | 12/2000 | Ishikawa et al. | |
| 6,911,733 | B2 | 6/2005 | Kikuchi et al. | |
| 2006/0249828 | A1* | 11/2006 | Hong | H01L 25/0652 257/686 |
| 2006/0273458 | A1* | 12/2006 | Huang | H01L 23/36 257/734 |

(Continued)

FOREIGN PATENT DOCUMENTS

| JP | 10-070159 | 3/1998 |
| JP | 2002-324872 | 11/2002 |

(Continued)

*Primary Examiner* — Jasmine J Clark
(74) *Attorney, Agent, or Firm* — Weneroth, Lind & Ponack, L.L.P.

(57) ABSTRACT

A semiconductor device with small variations in high frequency characteristics by suppressing variations in impedance while maintaining high heat radiation is provided. The semiconductor device including a semiconductor package having two terminals, a wiring board having an opening at which the semiconductor package is positioned and having two electrodes connected to the two terminals and a heat sink fixing the semiconductor package in which a center of the semiconductor package is decentered with respect to a center of the opening is used. Also, the semiconductor device in which a center of the two electrodes is decentered from a center of the opening is used.

10 Claims, 10 Drawing Sheets

(56) References Cited

U.S. PATENT DOCUMENTS

| | | | |
|---|---|---|---|
| 2011/0294440 A1 | 12/2011 | Ishino | |
| 2012/0256707 A1* | 10/2012 | Leiba | ............... H01P 3/003 333/208 |
| 2017/0373652 A1 | 12/2017 | Moriya et al. | |

FOREIGN PATENT DOCUMENTS

| | | |
|---|---|---|
| JP | 2017-228966 | 12/2017 |
| WO | 2009/037995 | 3/2009 |

\* cited by examiner

SEMICONDUCTOR DEVICE HAVING SEMICONDUCTOR PACKAGE IN A WIRING BOARD OPENING

TECHNICAL FIELD

The technical field relates to a structure of a semiconductor device in which a semiconductor package is inserted into a through hole provided on a substrate.

BACKGROUND

As this kind of semiconductor device, there has been hitherto proposed a structure including a substrate having an opening piercing from one surface to the other surface of the substrate, a semiconductor package and a heat sink fixing the semiconductor package, in which heat generated from the semiconductor package is radiated by bonding the semiconductor package to the heat sink by solder or the like (for example, refer to WO2009/037995 (Patent Literature 1)).

SUMMARY

The structure of Patent Literature 1 will be explained with reference to a cross-sectional view of FIG. 10.

Here, the related-art semiconductor device includes a plate 104, a wiring board 102, a semiconductor package 101 and a case 105, in which the wiring board 102 is bonded to the plate 104, the semiconductor package 101 is inserted into an opening 103 of the wiring board 102, the plate 104 and the semiconductor package 101 are electrically connected, and the plate 104 is bonded to the case 105. Accordingly, the case 105 makes contact with the plate 104 to thereby radiate heat from the semiconductor package 101 to the case.

Figure 10:
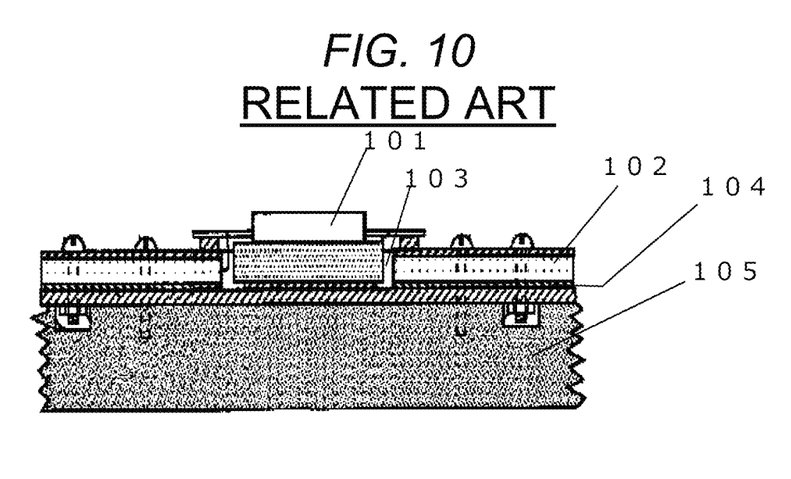
FIG. 10 is a cross-sectional view of a semiconductor device according to an embodiment of a related-art technique.

However, a position of the semiconductor package 101 is not regulated with respect to the opening 103 of the wiring board 102 in the related art structure as shown in FIG. 10. Therefore, a gap is generated between the semiconductor package 101 and the opening 103 of the wiring board 102 and impedance varies due to occurrence of parasitic capacitance, therefore, there is a problem that variations occur in high frequency characteristics as a product.

The present disclosure has been made for solving the above related-art problem, and an object thereof is to provide a semiconductor device with small variations in high frequency characteristics by suppressing variations in impedance while maintaining high heat radiation.

In order to achieve the above object, a semiconductor device including a semiconductor package having two terminals, a wiring board having an opening at which the semiconductor package is positioned and having two electrodes connected to the two terminals and a heat sink fixing the semiconductor package in which a center of the semiconductor package is decentered with respect to a center of the opening is used.

As described above, when adopting the semiconductor device according to the present disclosure, the center of outer side ends of the electrodes arranged on the wiring board connecting to terminals arranged at both ends of the semiconductor package with the terminals at facing two sides with respect to the semiconductor package is decentered from the center of the opening of the wiring board to thereby reduce a gap between the semiconductor package and the opening of the wiring board and suppress variations in impedance due to occurrence of parasitic capacitance, which can reduce variations in high frequency characteristics as a product.

DESCRIPTION OF EMBODIMENTS

Hereinafter, embodiments of the present disclosure will be explained with reference to the drawings. Each of the embodiments explained below shows one specific example. Numerals, shapes, materials, components, arrangement positions and connecting states of components, the order of steps and so on shown in the following embodiments are merely examples, which do not limit the present disclosure.

In the components according to the following embodiments, components not described in an independent claim indicating the broadest concept will be explained as arbitrary components. However, excessively detailed explanation may be omitted. For example, detailed explanation of a well-known item and repeated explanation of substantially the same structures may be omitted. This is for avoiding the following explanation from being unnecessarily redundant and for ease of understanding.

First Embodiment

<Structure>

Figure 1A:
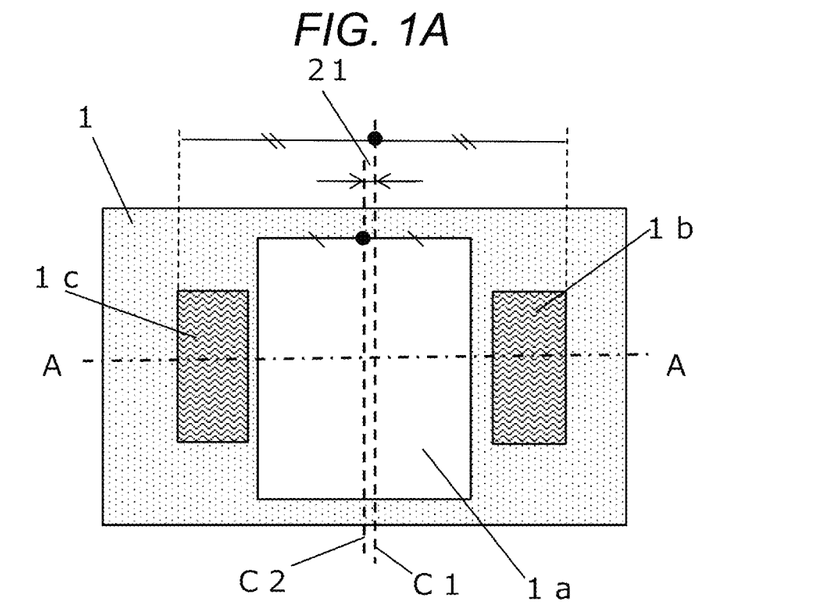
FIG. 1A is a plan view of a wiring board of a semiconductor device according to a first embodiment of the present disclosure and FIG. 1B is a top view of FIG. 1A.
Figure 1B:
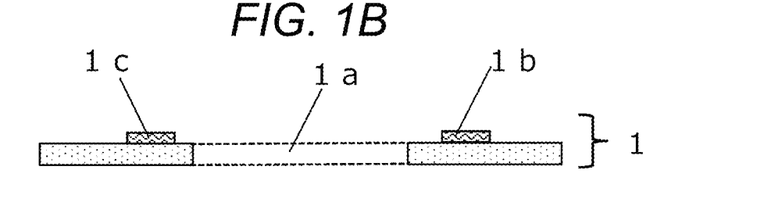

FIG. 1A is a top view of a wiring board 1 of a semiconductor device according to a first embodiment of the present disclosure. FIG. 1B is a cross-sectional view taken along A-A line of the wiring board 1 of the semiconductor device according to the first embodiment of the present disclosure.

As shown FIG. 1A and FIG. 1B, an opening 1a for mounting a component, an output-side electrode 1b and an input-side electrode 1c for obtaining electrical connection with respect to the mounted component are formed on the wiring board 1. Normally, a center C1 in an A-A cross-sectional direction between the output-side electrode 1b and the input-side electrode 1c and a center C2 in the A-A cross-sectional direction of the opening 1a of the wiring board 1 formed on the wiring board 1 for mounting the component are designed to be the same position. However, in this case, the center C1 is decentered (21) to the output-side electrode 1b side with respect to the center C2.

The center C1 may be a center between an outer side end of the output-side electrode 1b and an outer side end of the input-side electrode 1c.

In this case, a line of the center C1 is decentered to the output-side electrode 1b with respect to a line of the center C2 by the decentering 21. An amount of decentering 21 is preferably approximately 0.1 to 2.0 mm in consideration of processing accuracy of the opening 1a of the wiring board 1, mounting accuracy of the component in a post-process, and is set to 0.3 mm in the embodiment.

As a method of forming the output-side electrode 1b and the input-side electrode 1c, an Au layer was deposited 0.05 μm over the deposition of an Ni layer of 4 μm on copper foil both by an electroplating method.

<Manufacturing Method>

FIGS. 2A to 2E are process diagrams showing a manufacturing method of the semiconductor device according to the first embodiment of the present disclosure.

Figure 2A:
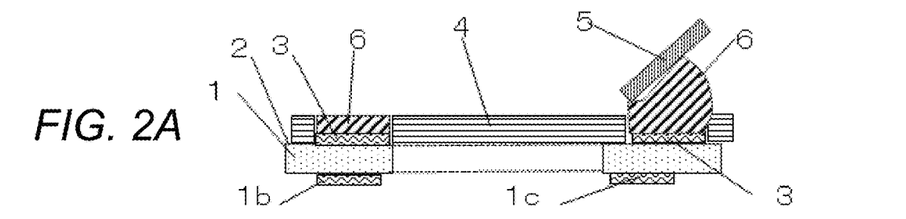
FIG. 2A to 2E are process diagrams showing a manufacturing method of the semiconductor device according to the first embodiment of the present disclosure.

As shown in FIG. 2A, a solder paste 6 is printed on an electrode 3 for connecting a heat sink that is on a first face 2 of the wiring board 1 by using a metal mask 4 and a squeegee 5 by a printing method.

Figure 2B:
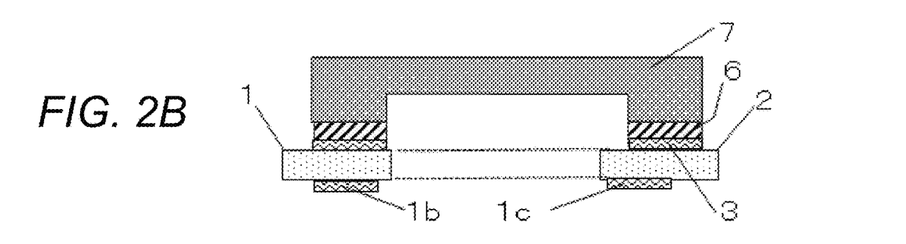

Next, as shown in FIG. 2B, a heat sink 7 having a cavity portion for adjusting a mounting height of the component is positioned with respect to the electrode 3 for connecting the heat sink on which the solder paste 6 is printed. Then, the heat sink 7 is mounted on the wiring board 1 by using a mounter. After that, the solder paste 6 is heated to 245 degrees by reflow to be melted and fixes the heat sink 7 over the wiring board 1.

Though the wiring board 1 and the heat sink 7 are fixed by using the solder paste in this case, a thermosetting resin such as epoxy resin or a mechanical fixing method such as caulking can be used.

Figure 2C:
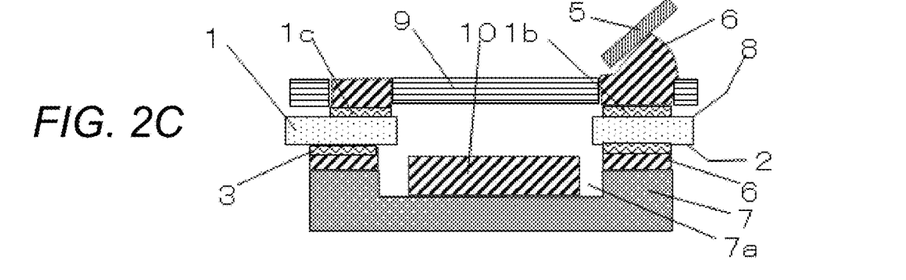

Next, as shown in FIG. 2C, the solder paste 6 is printed on the output-side electrode 1b and the input-side electrode 1c that are on a second face 8 of the wiring board 1 by using a metal mask 9 and the squeegee 5 by the printing method. Moreover, a plate-shaped solder preform 10 containing a flux is mounted on a cavity portion 7a of the heat sink 7 by using a mounter. Though the solder preform is used for the cavity portion 7a of the heat sink 7 in which solder printing is difficult due to a complicated structure, solder printing is also possible by using a metal mask with a cavity structure. The solder can be also printed on the side of the component to be mounted later. The supply of solder to the electrodes of the wiring substrate 1 and the cavity portion 7a of the heat sink 7 may be performed by a coating method using a dispenser, not limited to the printing method using the metal mask.

Figure 2D:
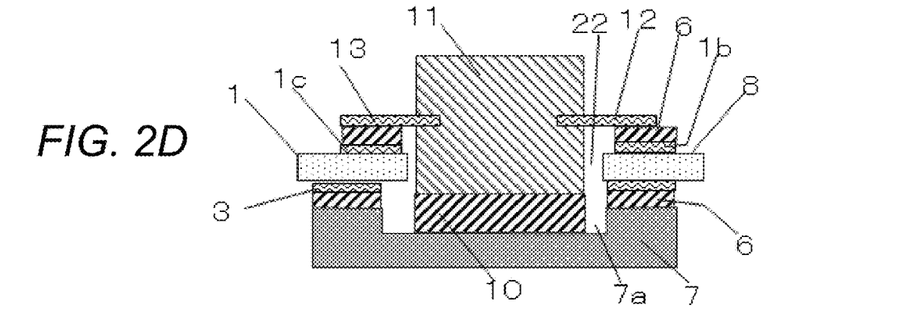

Next, as shown in FIG. 2D, the solder paste 6 printed on the output-side electrode 1b and the input-side electrode 1c that are on the second face 8 of the wiring board 1 is positioned with respect to an output-side terminal 12 and an input-side terminal 13 of a semiconductor package 11, which are mounted by using a mounter. At this time, a bottom portion of the semiconductor package 11 is allowed to contact the solder preform 10 mounted on the cavity portion 7a of the heat sink 7.

The output-side terminal 12 and the input-side terminal 13 are not wire but plate-shaped conductors, which are metal plates.

In this case, the center C1 between outer side ends in the A-A cross-sectional direction of the output-side electrode 1b and the input-side electrode 1c formed on the wiring board 1 is decentered to the output-side electrode 1b side by the decentering 21 with respect to the center C2 in the A-A cross-sectional direction of the opening 1a of the wiring board 1 as shown in FIG. 1. The semiconductor package 11 is arranged so as to correspond to the center C2. Accordingly, the solder paste 6 on the output-side electrode 1b of the wiring board 1 is not completely covered with the output-side terminal 12 of the semiconductor package 11, and part of an outer side is exposed.

According to the above structure, when the solder paste 6 in a section of the semiconductor package 11 and the solder preform 10 are melted in subsequent reflow heating, a self-alignment force that pulls the semiconductor package 11 in the direction of the output-side terminal 12 acts due to tension of the solder paste 6.

Figure 2E:
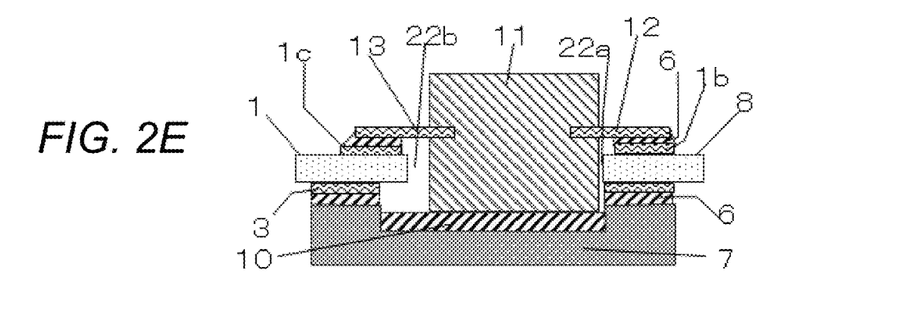

As a result, as shown in FIG. 2E, a semiconductor device in which a gap 22a of the output-side terminal 12 between a side surface of the semiconductor package 11 and the opening 1a of the wiring board 1 is smaller than a gap 22b of the input-side terminal 13 can be manufactured.

High frequency characteristics such as gain and efficiency are largely affected by the size of the gap 22a between the side surface of the semiconductor package 11 on the output-side terminal 12 side and the opening 1a of the wiring board 1, however, when the gap 22a between the side surface of the semiconductor package 11 on the output-side terminal 12 side and the opening 1a of the wiring board 1 is reduced by the above structure, variations in impedance due to occurrence of parasitic capacitance is reduced, thereby reducing variations in high frequency characteristics as a product.

That is, the semiconductor device in which the center of the semiconductor package 11 is decentered with respect to the center C2 of the opening 1a is obtained.

It is also preferable that a center between the two terminals (the output-side terminal 12 and the input-side terminal 13) be decentered, not the center between the output-side electrode 1b and the input-side electrode 1c, with respect to the center C2 of the opening 1a. The center between the two terminals (the output-side terminal 12 and the input-side terminal 13) indicates the center between terminal portions protruding to the outside from the semiconductor package 11 in respective terminals.

Second Embodiment

A second embodiment is almost the same as the first embodiment, therefore, detailed explanation of common parts is omitted and only different parts will be chiefly explained. Items not explained are the same as those of the first embodiment.

Figure 3A:
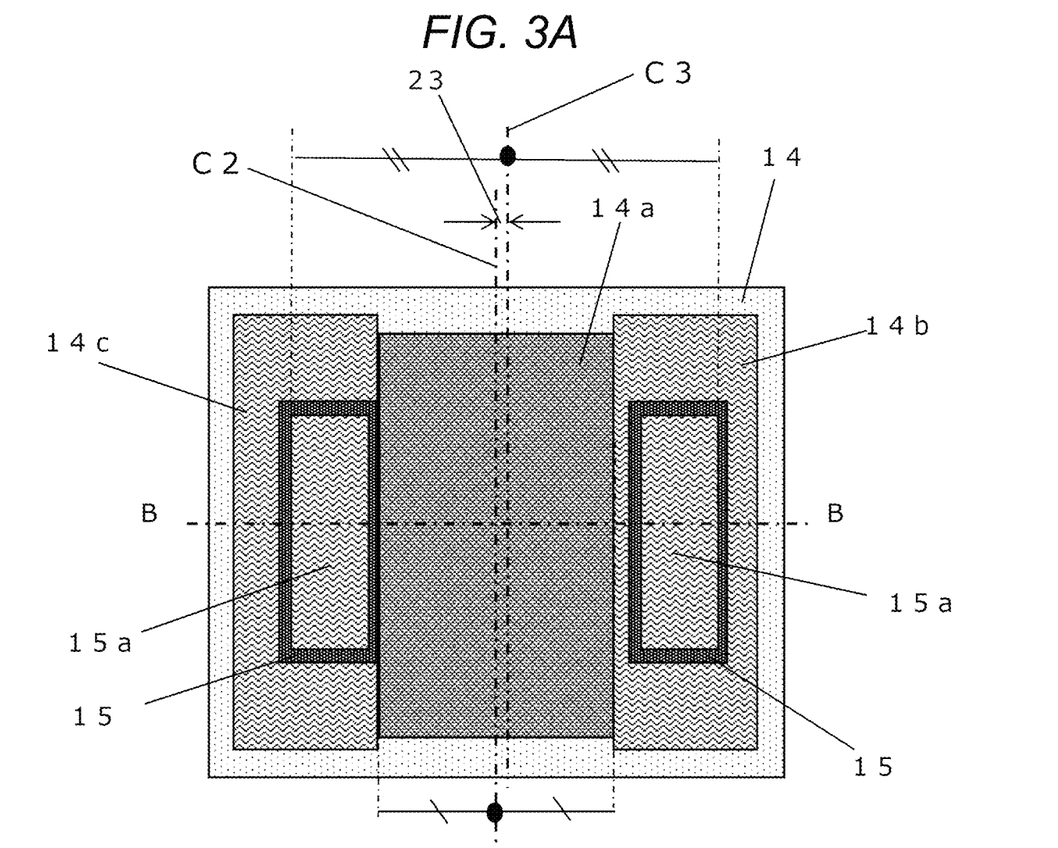
FIG. 3A is a plan view of a wiring board of a semiconductor device according to a second embodiment of the present disclosure and FIG. 3B is a top view of FIG. 3A.
Figure 3B:
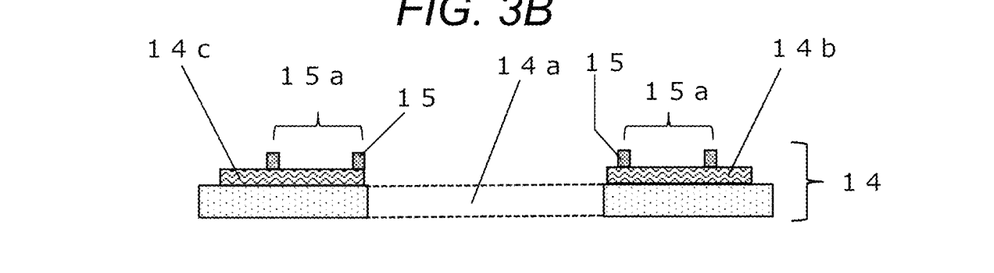

FIG. 3A is a top view of a wiring board 14 of a semiconductor device according to the second embodiment of the present disclosure. FIG. 3B is a cross-sectional view taken along B-B line of the wiring board 14 of the semiconductor device according to the second embodiment of the present disclosure. A difference from FIG. 1A and FIG. 1B shown in the first embodiment is that connection regions 15a on which terminals of components of an output-side electrode 14b and an input-side electrode 14c provided on the wiring board 14 are mounted is surrounded by a solder resist 15.

The liquid solder resist 15 is exposed and developed after being applied to the wiring board 14 on which a circuit pattern is formed by the printing method, then, cured at a temperature of 150° for 60 minutes, thereby forming the solder resist 15 on the output-side electrode 14b and the input-side electrode 14c of the wiring board 14.

Figure 4A:
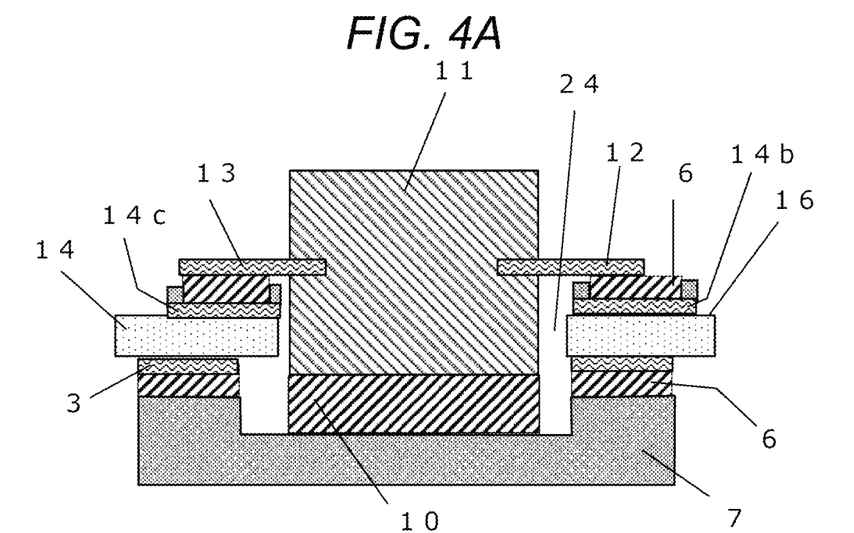
FIGS. 4A and 4B are process diagrams showing a manufacturing method of the semiconductor device according to the second embodiment of the present disclosure.

FIG. 4A is a view in which the solder paste 6 printed in the connection regions 15a on the output-side electrode 14b and the input-side electrode 14c that are on a second face 16 of the wiring board 14 is positioned with respect to the output-side terminal 12 and the input-side terminal 13 of the semiconductor package 11, which are mounted by using a mounter.

At this time, a line of the center C3 between the connection regions 15a in a B-B cross-sectional direction surrounded by the solder resist 15 formed on the wiring board 14 is decentered to the output-side electrode 14b side by a decentering 23 with respect to a line of the center C2 in the B-B cross-sectional direction of an opening 14a on the wiring board 14 as shown in FIG. 3A.

The center C3 may be a center between outer side ends of the connection regions 15a.

Accordingly, as shown in FIG. 4A, the solder paste 6 on the output-side electrode 14b of the wiring board 14 is not completely covered with the output-side terminal 12 of the semiconductor package 11, and part of an outer side is exposed.

According to the above structure, when the solder paste 6 in the section of the semiconductor package 11 and the solder preform 10 are melted in subsequent reflow heating, the self-alignment force that pulls the semiconductor package 11 in the direction of the output-side terminal 12 acts due to tension of the solder paste 6. Also at this time, positional accuracy of the solder paste is improved by forming the connection regions 15a on the output-side electrode 14b and the input-side electrode 14c of the wiring board 14, therefore, positional accuracy of the semiconductor package 11 after being pulled by the self-alignment force can be improved.

Figure 4B:
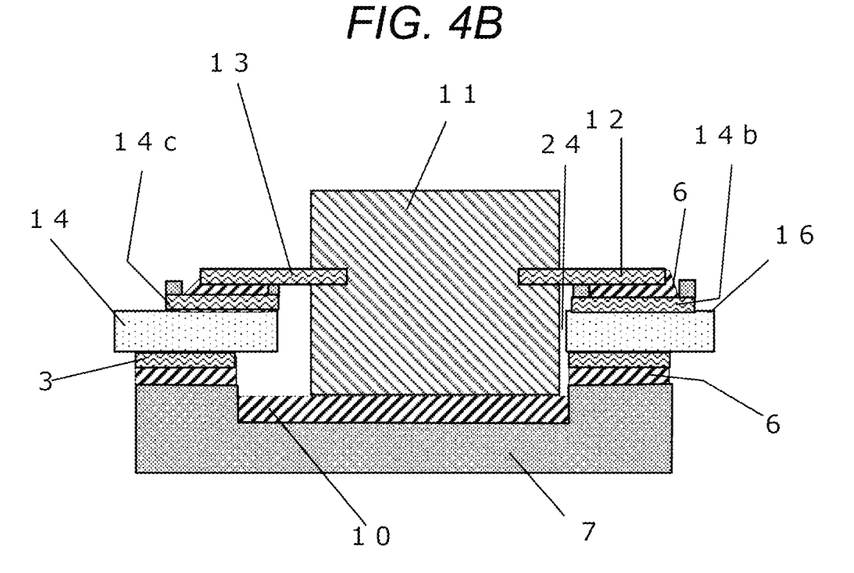

As a result, as shown in FIG. 4B, a semiconductor device in which a gap 24 between a side surface of the semiconductor package 11 and the opening 14a of the wiring board 14 is reduced can be manufactured.

High frequency characteristics such as gain and efficiency are largely affected by the size of the gap between the side surface of the semiconductor package 11 on the output-side terminal 12 side and the opening 14a of the wiring board 14. However, when adopting the above structure, the gap 24 between the side surface of the semiconductor package 11 on the output-side terminal 12 side and the opening 14a of the wiring board 14 is reduced to suppress variations in impedance due to occurrence of parasitic capacitance, thereby reducing variations in high frequency characteristics as a product.

Third Embodiment

A third embodiment is almost the same as both the first embodiment and the second embodiment, therefore, detailed explanation of common parts is omitted and only different parts will be chiefly explained. Items not explained are the same as those of the first and second embodiments.

Figure 5A:
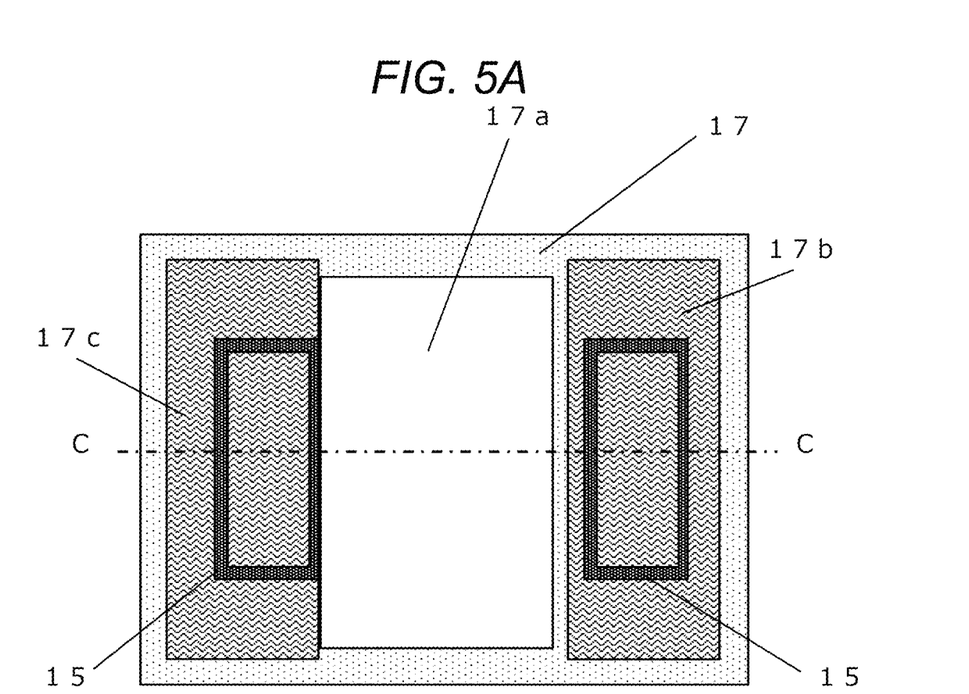
FIG. 5A is a plan view of a wiring board of a semiconductor device according to a third embodiment of the present disclosure and FIG. 5B is a top view of FIG. 5A.
Figure 5B:
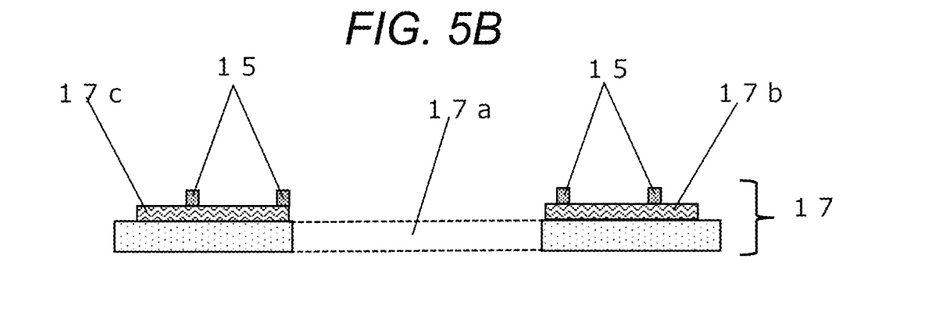

FIG. 5A is a top view of a wiring board 17 of a semiconductor device according to the third embodiment of the present disclosure. FIG. 5B is a cross-sectional view taken along C-C line of the wiring board 17 of the semiconductor device according to the third embodiment of the present disclosure. A difference from FIG. 3A and FIG. 3B shown in the second embodiment is that an opening 17a of the wiring board 17 is short only on the output-side electrode 17b side in a C-C cross-sectional direction. That is, the opening 17a deviates to the input-side electrode 17c side.

Figure 6A:
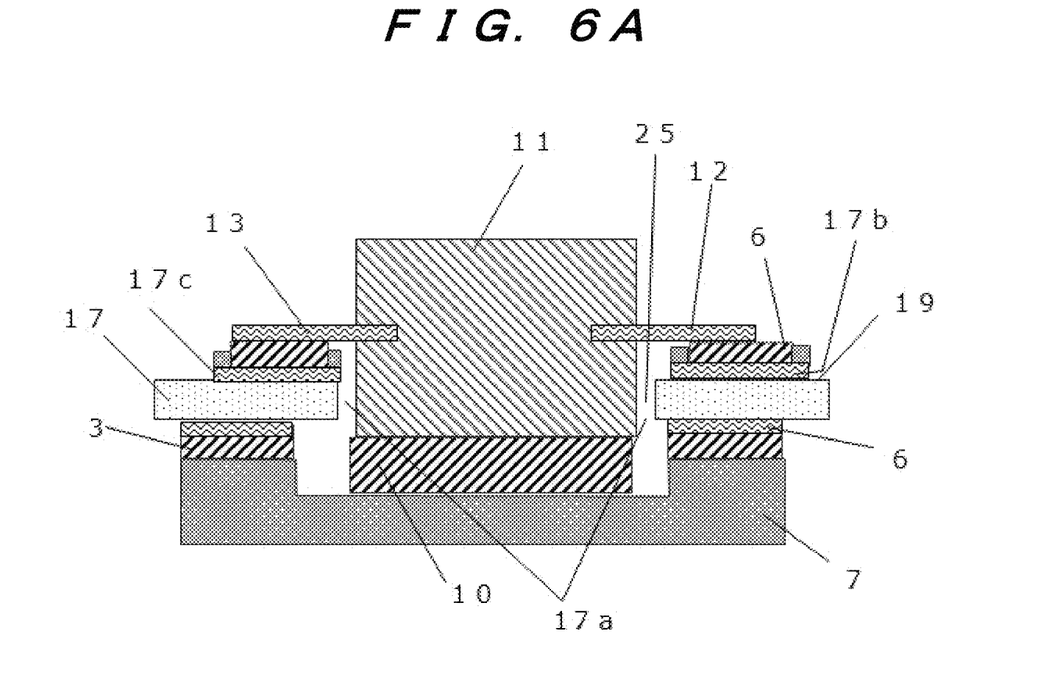
FIGS. 6A and 6B are process diagrams showing a manufacturing method of the semiconductor device according to the third embodiment of the present disclosure.

FIG. 6A is a view in which the solder paste 6 printed on the output-side electrode 17b and the input-side electrode 17c that are on a second face 19 of the wiring board 17 is positioned with respect to the output-side terminal 12 and the input-side terminal 13 of the semiconductor package 11, which are mounted by using a mounter. At this time, the mounting of the semiconductor package 11 is positioned with respect to a center of the opening 17a of the wiring board 17, therefore, a side surface of the semiconductor package 11 does not contact a side surface of the opening 17a of the wiring board 17.

Figure 6B:
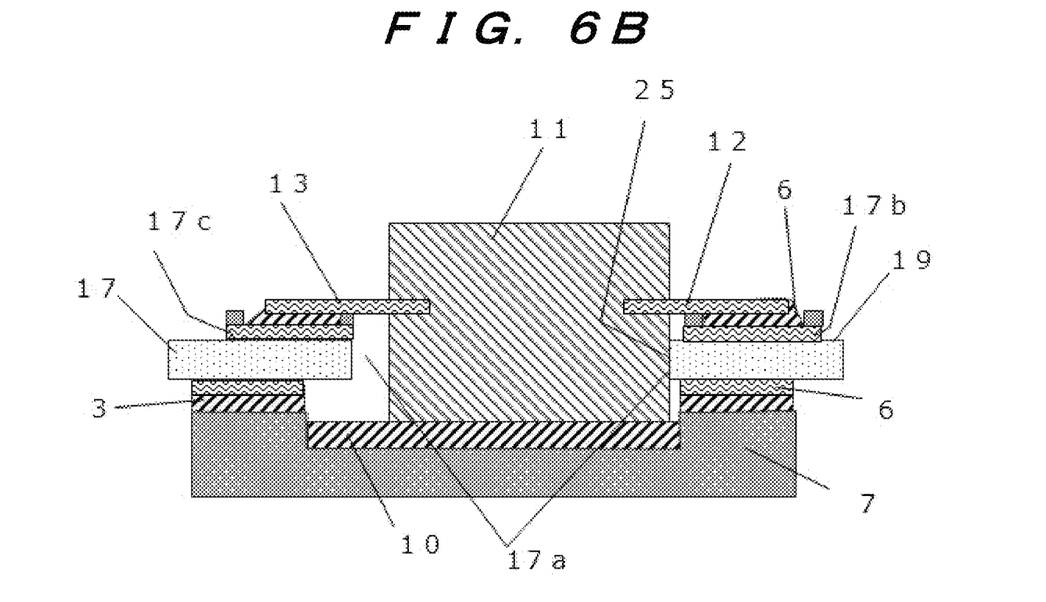

Next, when the solder paste 6 is heated to 245 degrees by reflow, and the solder paste 6 under the output-side terminal 12 and the input-side terminal 13 of the semiconductor package 11 and the solder preform 10 under the semiconductor package 11 are melted at the same time in subsequent reflow heating under the above structure, the self-alignment force that pulls the semiconductor package 11 in the direction of the output-side terminal 12 acts due to tension of the solder paste 6. At this time, the opening 17a of the wiring board 17 is short only on the output-side electrode 17b side in the C-C cross-sectional direction, therefore, a position of the semiconductor package 11 is determined at a position where the side surface of the semiconductor package 11 contacts the side surface of the opening 17a of the wiring board 17, which realizes fixing at high accuracy. As a result, as shown in FIG. 6B, a semiconductor device in which a gap 25 between the side surface of the semiconductor package 11 and the opening 17a of the wiring board 17 is reduced can be manufactured.

High frequency characteristics such as gain and efficiency are largely affected by the size of the gap 25 between the side surface of the semiconductor package 11 on the output-side terminal 12 side and the opening 17a of the wiring board 17, however, when the gap 25 between the side surface of the semiconductor package 11 on the output-side terminal 12 side and the opening 17a of the wiring board 17 is reduced by the above structure to suppress variations in impedance due to occurrence of parasitic capacitance, thereby reducing variations in high frequency characteristics as a product.

In the explanation of the above embodiment, the position of the semiconductor package 11 is determined at a position where the side surface of the semiconductor package 11 contacts the side surface of the opening 17a of the wiring board 17 at the time of reflow to realize fixing at high accuracy. However, respective components contact each other in a thermally expanded state due to high temperature in the actual reflow, therefore, respective components do not always contact each other in a state where the components are cooled and contracted and there is a case where there is a gap of approximately several ten μm. Also in the explanation of the above embodiment, the shape of the opening in the wiring board is a rectangular shape, however, the present disclosure is not limited to this, and the opening may have a shape with a partial convex shape seen from above.

Fourth Embodiment

A fourth embodiment is almost the same as both the first embodiment and the second embodiment, therefore, detailed explanation of common parts is omitted and only different parts will be chiefly explained. Items not explained are the same as those of the first and second embodiments.

Figure 7A:
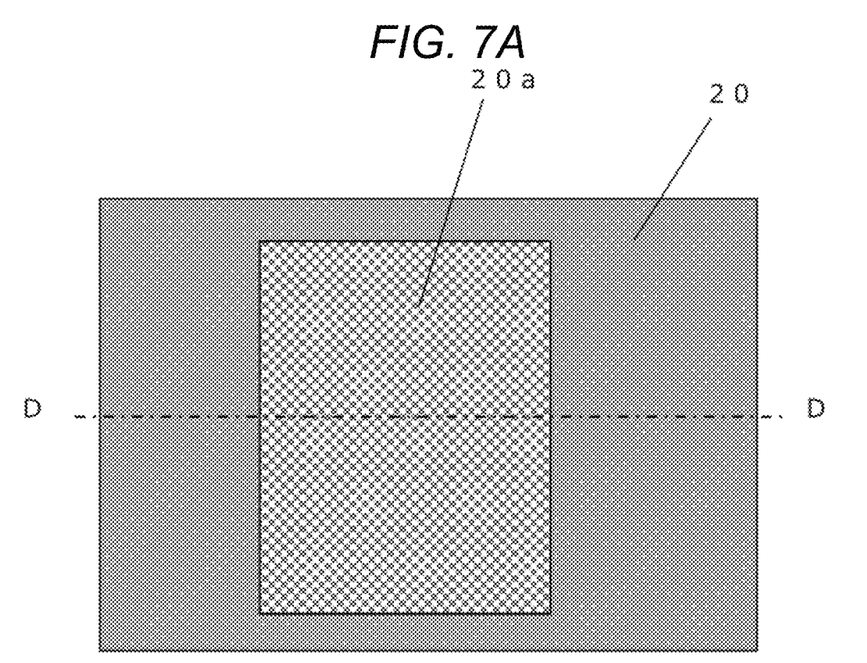
FIG. 7A is a plan view of a heat sink of a semiconductor device according to a fourth embodiment of the present disclosure and FIG. 7B is a top view of FIG. 7A.
Figure 7B:
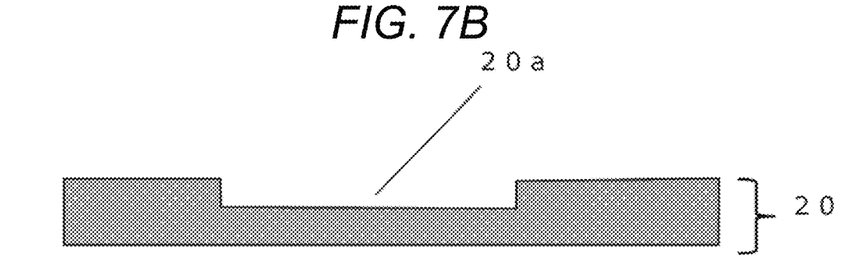

FIG. 7A is a top view of a heat sink 20 of a semiconductor device according to the fourth embodiment of the present disclosure. FIG. 7B is a cross-sectional view taken along D-D line of the heat sink 20 of the semiconductor device according to the fourth embodiment of the present disclosure. A difference from FIG. 4A and FIG. 4B shown in the second embodiment is that a cavity portion 20a of the heat sink 20 is short on the right side in a D-D cross-sectional direction. That is, the cavity portion 20a deviates to the left side.

Figure 8A:
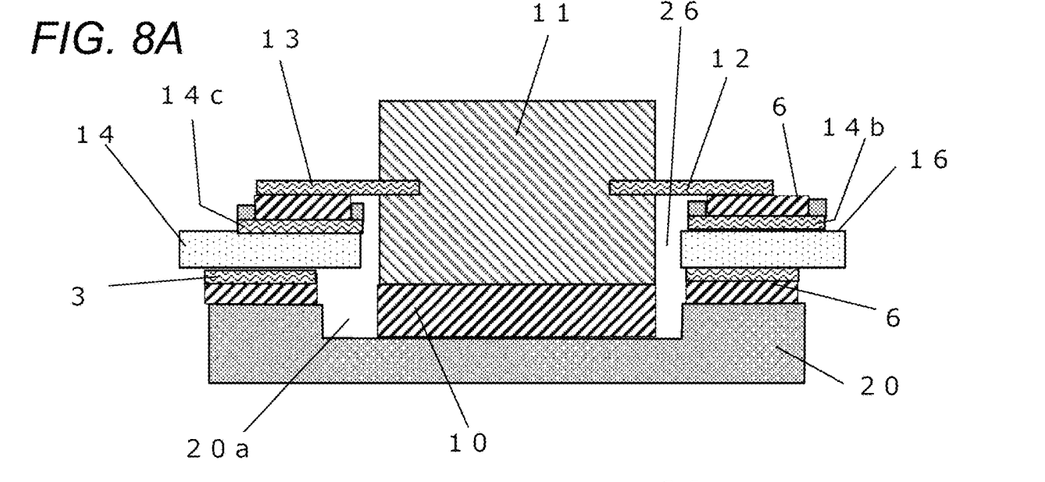
FIGS. 8A to 8C are process diagrams showing a manufacturing method of the semiconductor device according to the fourth embodiment of the present disclosure.

FIG. 8A is a view in which the solder paste 6 printed on the output-side electrode 14b and the input-side electrode 14c that are on the second face 16 of the wiring board 14 is positioned with respect to the output-side terminal 12 and the input-side terminal 13 of the semiconductor package 11, which are mounted by using a mounter. At this time, the mounting of the semiconductor package 11 is positioned with respect to the center of the opening 14a of the wiring board 14, therefore, the side surface of the semiconductor package 11 does not contact the side surface of the cavity portion 20a of the heat sink 20.

Next, when the solder paste 6 is heated to 245 degrees by reflow, and the solder paste 6 under the output-side terminal 12 and the input-side terminal 13 of the semiconductor package 11 and the solder preform 10 under the semiconductor package 11 are melted at the same time in subsequent reflow heating under the above structure, the self-alignment force that pulls the semiconductor package 11 in the direction of the output-side terminal 12 acts due to tension of the solder paste 6.

At this time, the cavity portion 20a of the heat sink 20 is shorter on the right side in the D-D cross-sectional direction, therefore, a position of the semiconductor package 11 is determined at a position where the side surface of the semiconductor package 11 contacts the side surface of the cavity portion 20a of the heat sink 20, which realizes fixing at high accuracy.

Figure 8B:
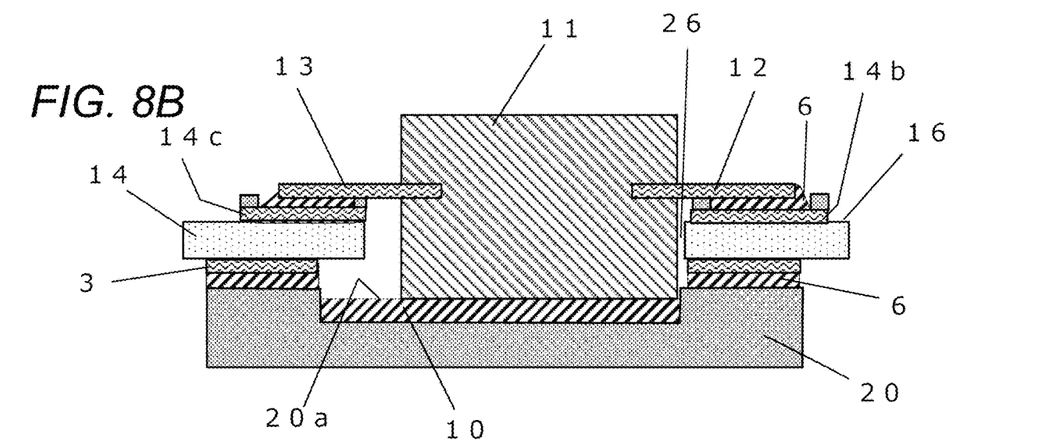

As a result, as shown in FIG. 8B, a semiconductor device in which a gap 26 between the side surface of the semiconductor package 11 and the opening 14a of the wiring board 14 is reduced can be manufactured.

High frequency characteristics such as gain and efficiency are largely affected by the size of the gap 26 between the side surface of the semiconductor package 11 on the output-side terminal 12 side and the opening 14a of the wiring board 14, however, when the gap 26 between the side surface of the semiconductor package 11 on the output-side terminal 12 side and the opening 14a of the wiring board 14 is reduced by the above structure to suppress variations in impedance due to occurrence of parasitic capacitance, thereby reducing variations in high frequency characteristics as a product.

In the explanation of the above embodiment, the position of the semiconductor package 11 is determined at a position where the side surface of the semiconductor package 11 contacts the side surface of the cavity portion 20a of the heat sink 20 at the time of reflow to realize fixing at high accuracy. However, respective components contact each other in a thermally expanded state due to high temperature in the actual reflow, therefore, respective components do not always contact each other in a state where the components are cooled and contracted and there is a case where there is a gap of approximately several ten µm.

Also in the explanation of the above embodiment, the shape of the cavity portion of the heat sink is a rectangular shape, however, the present disclosure is not limited to this, and the opening may have a shape with a partial convex shape seen from above.

Figure 8C:
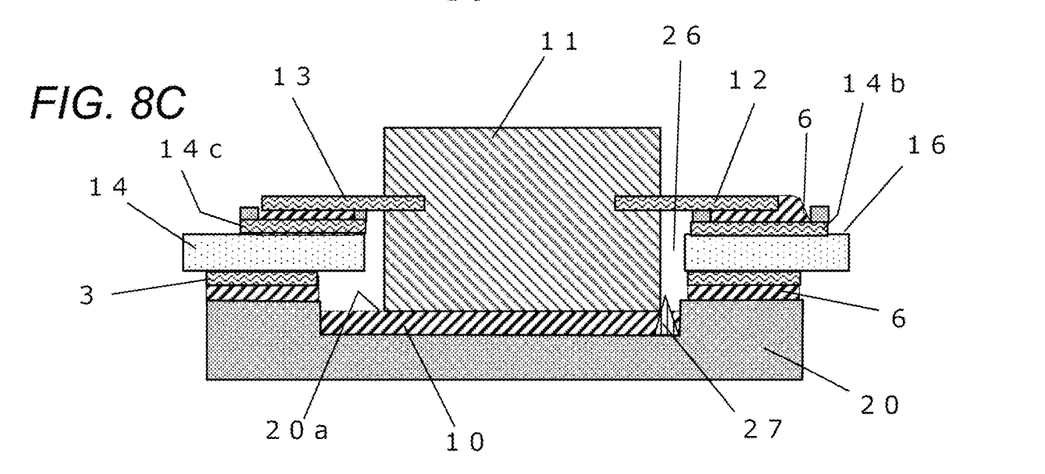

Furthermore, a convex portion 27 is partially formed on a bottom surface of the cavity portion seen from above as shown in FIG. 8C to allow the semiconductor package 11 to contact the convex portion 27, thereby regulating the position of the semiconductor package 11 at high accuracy.

Fifth Embodiment

A fifth embodiment relates to a heat sink 28 that can be applied to any of the first embodiment to the fourth embodiment. Items not explained are the same as those of the above embodiments.

Figure 9:
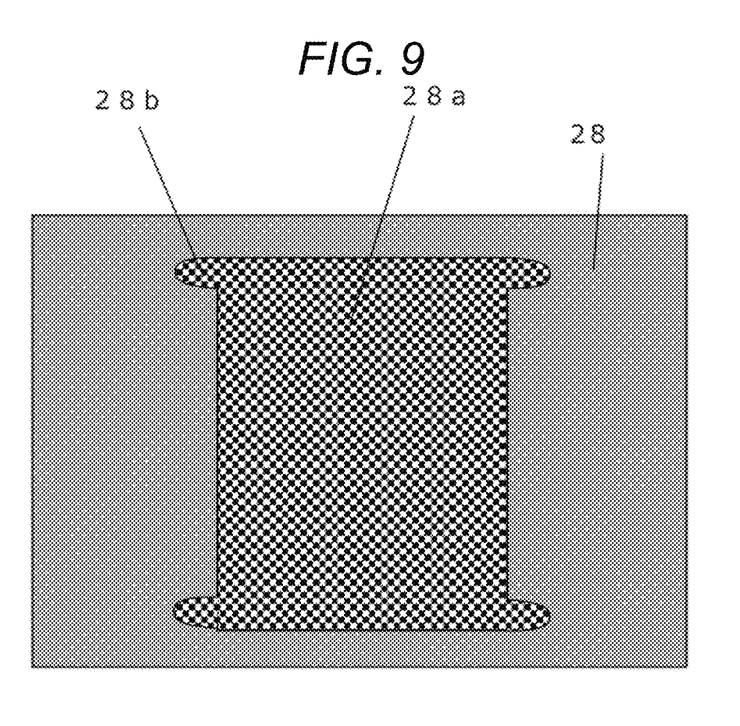
FIG. 9 is a plan view of a heat sink of a semiconductor device according to a fifth embodiment of the present disclosure.

FIG. 9 shows a plan view of a cavity portion 28a of a heat sink 28, and the cavity portion 28a having this shape may be provided in all embodiments described above.

The cavity portion 28a has a concave portion 28b at any of end portions of the cavity portion 28a. Part of side surfaces of the cavity portions 28a are extended. A bottom portion of the concave portion 28b has the same height as or deeper than a bottom surface of the cavity portion 28a.

Accordingly, when the solder preform 10 inside the cavity portion 28a is melted and the semiconductor package 11 moves, the molten solder can be housed in the concave portion 28b. As a result, the semiconductor package 11 easily moves. The semiconductor package 11 is not affected by flowing of solder.

The position of the concave portion 28b is preferably a corner part of the cavity portion 28a. The concave portion 28b is preferably positioned at a corner of the cavity portion 28b on the side to which the semiconductor package 11 moves.

(Overview)

The first to fourth embodiments may be combined with each other. The explanation has been made by the semiconductor package, however, the present disclosure can be applied to components with two terminals such as electronic components.

The semiconductor device according to the present disclosure can be applied to electronic components. In particular, the semiconductor device can be used as a device on which a power device-type electronic component is mounted.

What is claimed is:

1. A semiconductor device comprising:
   a semiconductor package having two terminals;
   a wiring board having an opening at which the semiconductor package is positioned and having two electrodes connected to the two terminals; and
   a heat sink fixing the semiconductor package,
   wherein a center of the semiconductor package is decentered with respect to a center of the opening.

2. The semiconductor device according to claim 1,
   wherein a center of the two electrodes is decentered from the center of the opening.

3. The semiconductor device according to claim 1,
   wherein a center of the two terminals is decentered from the center of the opening.

4. The semiconductor device according to claim 1,
   wherein the two electrodes are respectively provided with connection regions connected to the two terminals and filled with solder, and
   a center of the two connection regions is decentered from the center of the opening.

5. The semiconductor device according to claim 1,
   wherein a side surface of the semiconductor package contacts a side surface of the opening of the wiring board.

6. The semiconductor device according to claim 1,
wherein the side surface of the semiconductor package contacts a side surface of a cavity portion of the heat sink.

7. The semiconductor device according to claim 6,
wherein the side surface of the semiconductor package contacts a side surface of a convex portion arranged in the cavity portion of the heat sink.

8. The semiconductor device according to claim 1,
wherein the terminals are plate-shaped terminals.

9. The semiconductor device according to claim 1,
wherein the terminals and the electrodes are connected through solder.

10. The semiconductor device according to claim 6,
wherein the cavity portion has a concave portion at an outer periphery.

* * * * *